United States Patent [19]

King et al.

[11] 4,093,957

[45] June 6, 1978

[54] SOS EXTRINSIC INFRARED DETECTOR AND READ-OUT DEVICE

[75] Inventors: Gerard J. King, Alexandria; Joseph F. Martino, Falls Church, both of Va.

[73] Assignee: The United States of America as represented by the Secretary of the Army, Washington, D.C.

[21] Appl. No.: 705,641

[22] Filed: Jul. 15, 1976

[51] Int. Cl.$^2$ .................... H01L 29/78; H01L 27/14
[52] U.S. Cl. ...................... 357/24; 250/370; 357/30; 357/80
[58] Field of Search ............ 357/24, 30, 60, 80; 250/332, 370, 330, 338

[56] References Cited

U.S. PATENT DOCUMENTS

| 3,849,651 | 11/1974 | Ennulat | 357/24 |
| 3,883,437 | 5/1975 | Nummedal et al. | 357/30 |

FOREIGN PATENT DOCUMENTS 1,306,735  2/1973  United Kingdom ................ 357/30

OTHER PUBLICATIONS

Gerritsen et al., "An Infrared Image Converter Equipped with an Array of Extrinsic Silicon Photodetectors", *IEE Transactions on Electron Devices*, vol. Ed. 18, No. 11, Nov. 1971, pp. 1011–1015.

Primary Examiner—Stanley D. Miller, Jr.
Assistant Examiner—James W. Davie
Attorney, Agent, or Firm—Nathan Edelberg; Max L. Harwell; Robert P. Gibson

[57] ABSTRACT

A silicon-on-sapphire, or silicon-on-spinel (SOS), epitaxial detector and readout structure and method of preparation. The present structure comprises silicon devices formed on sapphire, or spinel, substrates in which delineated silicon detectors, and electrically and optically isolated charge-coupled devices (CCDs), are used for signal readout from the detectors. The structure may be placed at the focal plane of an imaging infrared (IR) system for signal readout therefrom.

8 Claims, 7 Drawing Figures

SOS EXTRINSIC INFRARED DETECTOR AND READ-OUT DEVICE

The invention described herein may be manufactured, used, and licensed by or for the U.S. Government for governmental purposes without the payment of any royalties thereon.

BACKGROUND OF THE INVENTION

Several efforts are underway to use silicon planar processing to fabricate large arrays of extrinsic silicon infrared (IR) detectors. Arrays of thousands of detectors are required for future IR imaging systems, and cost considerations will require large scale integration in planar silicon wafers which are doped with appropriate impurities to attain IR sensitivity wherein the detectors are not delineated, and optical and electrical cross-talk severely limit the density of the detectors.

Special efforts are also required to delimit the dopant materials used in the detectors from entering the CCD structures which are a part of the same silicon wafer. Selection of the dopant materials are restricted to those which diffuse very slowly at temperatures (1000° -1200°) commonly used in silicon CCD processing. The only known 3-5 micrometer wavelength dopant which may be compatible with the CCD structure is the metal indium. This dopant is a very slow diffusant in silicon, has low solubility, and thus has low optical absorption in silicon. This is very restrictive since slow diffusant dopants at the 1000° -1200° C CCD processing temperature generally have low solubility. Thus efficient extrinsic silicon detectors must be very thick to be efficient since optical absorption is otherwise very small. If the detectors are thick, the optical and electrical cross-talk will be severe.

The apparatus of the present invention overcomes these problems since there is complete chemical isolation of the detectors from the CCD structure and thus the dopant is not limited to indium by may include a wide variety of either slow or rapid diffusant dopants that are incompatible with the CCD structure. Also, the SOS based structure will eliminate optical and electrical cross-talk and permit very close spacing of the detectors in the focal plane of the IR imager.

SUMMARY OF THE INVENTION

The present invention relates to SOS technology which allows one to grow a high quality layer of single crystal silicon on a surface of a single crystal substrate of electrical insulator material, such as sapphire, or spinel.

By the process of non-selective and/or orientationally dependent chemical etching, a silicon CCD signal readout structure and a plurality of individual silicon detectors, in close proximity to the silicon CCD signal readout structure, are prepared on the substrate. The substrate is preferably a single crystal sapphire substrate. The detectors are isolated electrically, optically, and chemically from the CCD structure.

The sapphire material is transparent in the 3-5 micrometer IR wavelength region and, if desired, may therefore be used as a window material for the silicon detectors at these wavelengths.

The silicon CCD signal readout structure and individual silicon detectors are isolated from each other by chemically etching through the silicon layer down to the sapphire substrate by using etching masks to delineate the silicon areas.

The CCD structure is then completely covered by a protective mask and the silicon detectors are doped into extrinsic silicon detectors.

Following the step of doping the silicon detectors, the resulting extrinsic detectors are masked. The mask is then removed from the CCD structure. A plurality of input diffusions are next diffused into the silicon CCD structure. An insulating layer is deposited, or grown, over the CCD structure. The insulating layer is etched away from the plurality of input diffusions by the well known photolithographic process. The entire SOS-CCD wafer is then cleaned and the following metallized, or conductive, layer are deposited by first evaporating a metalized layer and then photolithographically etching away the silicon device side of the sapphire substrate: A buss line common to the inputs of all detectors, a plurality of detector output leads connected from each detector to each input diffusion, a plurality of input structure pads on the insulating layer in close proximity to said plurality of input diffusions and a common electrical lead connecting said plurality of input pads, a plurality of CCD pads and a plurality of CCD voltage drive lines electrically connected to intermittently repeated CCD pads with said plurality of input structure pads positioned between each of said input diffusions and said intermittently repeated CCD pads, and a lead from the silicon CCD structure to an electrical ground.

By proper biasing of the detectors and clocking of the plurality of input structure pads and CCD voltage drive lines, the CCD structure will readout the signals generated in the plurality of detectors.

Isolation of discrete silicon devices on the sapphire, or spinel substrate, is the main advantage of the present invention. The silicon detector island areas may be doped with any desired dopant material even though the dopant material is normally incompatible with CCD operation since the CCD structure is completely masked during the step of doping the silicon detectors and the bare sapphire substrate surface is highly insulative and thus completely delineates the detectors and the CCD structure.

DETAILED DESCRIPTION OF THE PREFERRED EMBODIMENT

Figure 1:
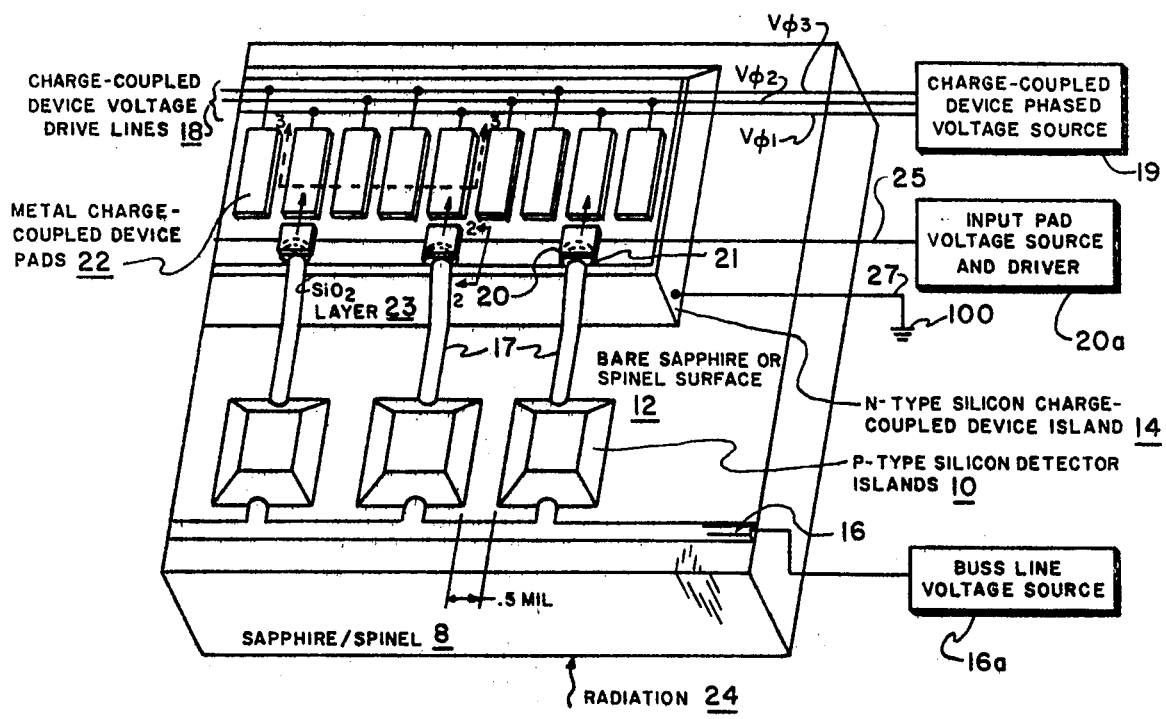
FIG. 1 illustrates silicon devices on a sapphire or spinel substrate of the present invention.

Refer now to FIG. 1 for an explanation of the present apparatus and the method of preparation. The method of producing the SOS-CCD wafer starts with a thin layer of electrical insulator substrate 8, such as single crystal sapphire or non-conducting spinel of a thickness necessary for the needed rigidity for holding the silicon devices to be deposited thereon. The thickness is not critical, but is suggested as being about 50 mils. A layer of single crystal silicon about 2 mils thick is then epitaxially deposited on one side of substrate 8. Substrate 8 will be explained herein as sapphire, but non-conducting spinel may be used equally as well.

Etching masks are placed over the silicon layer prior to etching silicon devices. By non-selective and/or orientationally dependent chemical etching completely through the silicon layer down to the bare sapphire surface 12, a plurality of individual intrinsic detector islands 10 and a silicon CCD island 14 are delineated on substrate 8. In, and only in, the orientationally dependent chemical etching, the delineated silicon devices have sloping edges with respect to the bare sapphire surface 12 of about 55° angle. This angle is inherent in chemical etching of the orientationally position <100> plane with the v-shaped side walls of the silicon layer being the <111> planes.

A major problem with extrinsic silicon detectors is that they do not strongly absorb infrared radiation, i.e. the dopants have low optical absorption or low optical density. It is difficult to get enough dopant into the single crystal silicon islands 10 to absorb light without adversely modifying the crystal. The orientationally etched island 10 edges of 55° angle allows a longer optical path, if the radiation comes in through the substrate, by internal reflection off the edges and hence allows low enough dopant concentration to preserve the good electrical properties of the silicon.

The etching masks are removed leaving islands 10 and island 14. Island 14 is also stated herein as a silicon CCD signal read-out structure 14. The base of islands 10 are generally about 2 mils width on the narrow sides, one of which faces island 14, and about 10–20 mils in length. There are about 0.5 mil distance between the 10–20 mils sides of islands 10. Islands 10 and island 14 are in proximity with each other but are electrically, chemically, and optically isolated since the bare sapphire surface 12 is an excellent insulator.

The next step is that the silicon CCD signal read-out structure 14 is entirely covered with a protective mask. The plurality of silicon detector islands 10 are doped into a plurality of extrinsic silicon detector islands possessing a desired infrared wavelength region by a suitable method, including diffusion or ion implantation or other suitable techniques. Since structure 14 is temporarily masked, it may also be feasible to thicken and dope the delineated detector islands 10 by epitaxy, such as liquid phase or chemical vapor deposition, during this step of the preparation of the SOS-CCD wafer. The dopant may be either a slow or rapid diffusant material that is basically incompatible with the silicon CCD signal read-out structure 14 which is processed as explained below. Meanwhile, during the short time required to dope the diffusant dopant materials into islands 10, none of the dopant materials will enter structure 14. Therefore, complete isolation of the detector island 10 from the CCD structure 14 is achieved.

Many diffusant dopant materials may be used in either p-type or n-type doping of the island 10 when the SOS technology is used.

Dopants, having high solubility and high optical cross-sections, are as follows. Some of the p-type dopants are: Cu, Zn, Cd, Be, Ni, In, Ga and Tl. Some of the n-type dopants are Pt, S, Mn, Fe, Ti, Se and rare earth elements, Nd and Th. Also, Au or Ag may be either n- or p-type.

In choosing the dopants, the n- or p-type nature will determine whether electrons or holes respectively will be the type of photoexcited carrier. The characteristic injection energy associated with each particular dopant in the silicon detector material determines the precise spectral cutoff on the long wavelength end and thereby determines the cryogenic temperature to which the detector material must be cooled for normal operation. Higher operating temperatures are desirable for most military system applications because of the need for less electrical input power to the cryogenic cooler. The freedom to select dopant materials will permit selection of a specific dopant allowing highest operating temperature and hence least load on the cooler power supply for cooler 48 shown in FIG. 4 in which the SOS-CCD wafer 46 will operate.

After the silicon detector islands are doped into extrinsic silicon detector islands according to the desired infrared wavelength region and the above mentioned highest desired operating temperature, the protective mask is removed from structure 14 and islands 10 are masked. A plurality of input diffusions 21 are diffused into island 14 using suitable masking with one of the input diffusions adjacent to one of the plurality of extrinsic silicon detector islands 10. The input diffusants 21 are preferable a slow diffusant, such as boron, and in this case a P±type slow diffusant. An insulating layer 23 is then deposited, or grown, over structure 14. This insulating layer is preferably a $SiO_2$ layer which is about 1500 Å thick. The areas of layer 23 which are directly over the input diffusions 21 are then removed by the well known photolithographic etching process.

Figure 5:
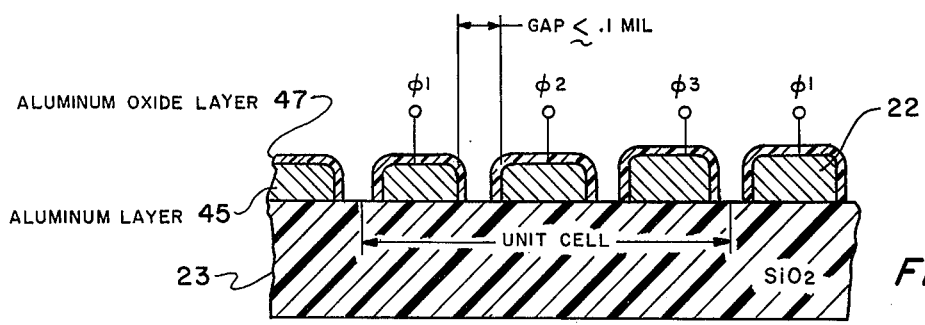
FIG. 5 illustrates a sectional view of a single level metal three phase CCD pad.
Figure 6:
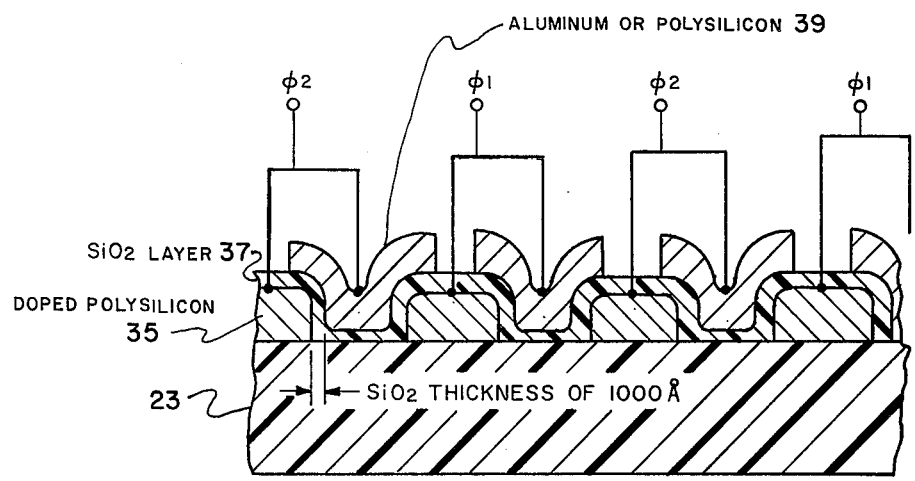
FIG. 6 illustrates a multilevel metal two phase CCD pad.
Figure 7:
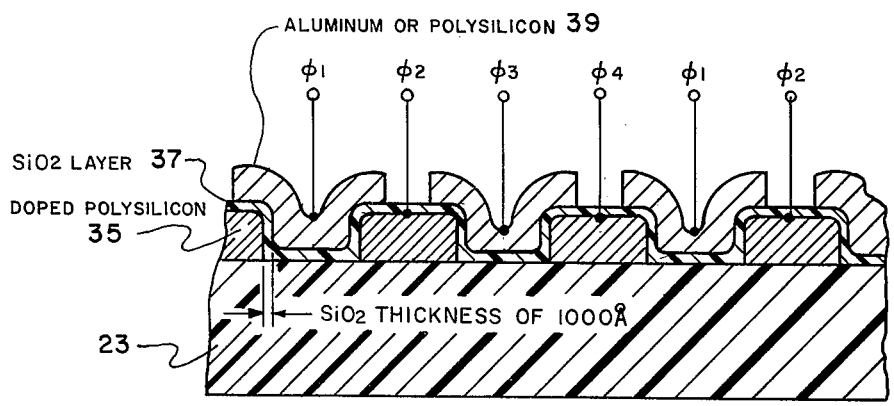
FIG. 7 illustrates a multilevel metal four phase CCD pad.

The entire wafer is next cleaned in some manner prior to depositing a metallized, or conductive layer thereon. The metallized layers may be either single level or multilevel metal layers according to the number of phases of CCD structure operation needed on insulating layer 23. However, if multilevel metal layers are needed on layer 23 for, say two or four phase CCD operation, all the other metal layers deposited on the bare sapphire surface 12 and the input CCD pads 20 on insulating layer 23 are completely etched off on each subsequent deposition by the photolithographic etching process until the last deposition of the metallized layer. The photolithographic etching process is employed after the last deposition to leave the appropriate conductive leads and pads on surface 12 and on the portions of island 14 and $SiO_2$ layer 23. The embodiment as illustrated by FIGS. 1 and 5 show the single level metal layers that are used in three phase CCD operation. FIGS. 6 and 7 illustrate two and four phase CCD operation depositions respectively which have multilevel (in the case two level) metal layers produced by the photolithographic etching process and will be discussed later.

Figure 2:
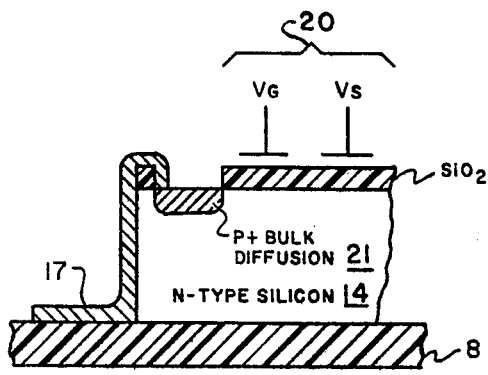
FIG. 2 shows a sectional view of FIG. 1 depicting the input to the CCD structure.

Refer not to FIGS. 1, 2, and 5 for discussion of the single level metallized layer deposition on the silicon side of substrate 8. First, a layer of aluminum is deposited over the silicon side and then by either the negative or positive photolithographic etching process the following conductive leads and pads remain intact. A buss line 16 is common to the input side of all extrinsic silicon detector islands 10 and is electronically connected to an external buss line voltage source 16a for injecting charge carriers from the islands 10 into the input diffusions 21 when infrared radiation impinges on the detector islands 10.

A ground lead 27 is connected from island 14 across the bare substrate surface 12 to some external ground connection, and a plurality of detector output leads 17 that are electrically connected between each of the output side of island 10 and one each of the plurality of input diffusions 21. A plurality of input structure pads 20 are positioned between said plurality of input diffusions 21 and an intermittent number of a plurality of CCD pads 22, which intermittent number is shown as three in FIG. 1, thus representing three phase CCD operation. A plurality of CCD voltage drive lines 18 are intermittently and commonly connected to the plurality of CCD pads 22 in some preselected phasing. This intermittently connected number is three, and thus every third CCD pad 22 is commonly electrically connected. Lines 18 are electrically connected to an external CCD phased voltage source 19. All of the plurality of input pads 20 are commonly connected by a metallic lead 25, with lead 25 electrically connected to an external input pad voltage source and driver 20a. The plurality of CCD pads 22 are shown in FIG. 5 as a plurality of aluminum layers 45 that have their outer area oxidized in an aluminum oxide layer 47. After deposition of all the above mentioned pads and leads, a final optional step includes glassing over the entire wafer with a low temperature coating to hermetically seal the entire wafer.

FIGS. 6 and 7 represent the two level metallization deposition for the CCD pads 22. In these embodiments the first metal layer is a doped polysilicon layer 35 that has been photolithographically etched into a plurality of pads and then a silicon dioxide layer 37 is deposited over the pads and the valleys therebetween. A second conductive layer 39, such as aluminum or polysilicon, is deposited over the entire silicon side of substrate 8 and is then selectively photolithographically etched to provide all of the other loads and pads (other than CCD pads 22) as mentioned above.

It should be noted that the separation between the various CCD pads, represented as the silicon dioxide layer 37 between layers 35 and 39, is about 1000 A in the two level metallization for the two and four phase CCD structure but is greater than .1 mil for the single level metallization for the three phase CCD structure. The narrower separation between the CCD pads of the two and four phased CCD switches is desirable.

Figure 3:
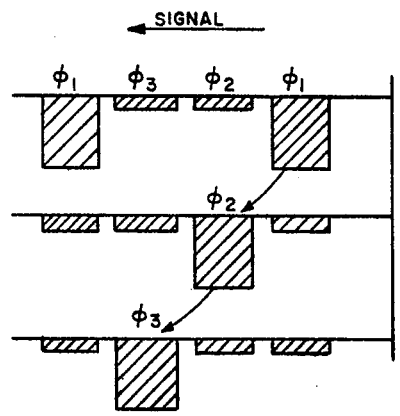
FIG. 3 shows a sectional view of FIG. 1 illustrating a typical charge carrier phase shift of the CCD structure.

The number of input diffusions 21 and input structure pads 20 will be different for the two and four phase CCD operation since the injected signals from the extrinsic silicon detector islands 10 are at either every second or fourth CCD pad 22 and there must be a change in the clocking and the voltages of sources 19 and 20a. Also depending on the time sequence of the clocking voltages, the signal may be driven to the left or to the right. FIG. 3 depicts a switching sequence of three phase operation where trapped carriers are swept from right to left.

The operation of a typical structure produced by the above method are as follows. Assuming that the CCD structure operates in three phase, the typically switched voltages are at, say time $T_1$, $V\Phi_1$ is O, $V\Phi_2$ is −15 volts, and $V\Phi_3$ is O. At the next instant of switching, say time $T_2$, $V\Phi_1$ is −15 volts, $V\Phi_2$ is O, and $V\Phi_3$ is −15 volts. Assume further that the extrinsic silicon detector islands 10 are doped p-type and are sensitive in the 3-5 micrometer wavelength region, island 14 is n±type silicon, and the input diffusions 21 are P±type bulk material. Radiation 24 entering islands 10 through sapphire substrate 8, which passes the 3-5 micrometer wavelength, will generate charge carriers within islands 10. The detector islands are photoconductive, i.e. conducts on the basis of optically injected carriers. However, photovoltaic intrinsic IR detectors may also be fabricated on the sapphire substrate. A fixed voltage of from +10 to +40 d.c. volts from buss line voltage source 16a is applied to buss line 16 and causes an increased current to flow when optical photons from radiation 24 increases the number of charge carriers.

The charge carrier concentration is present on the plurality of input diffusions 21 by way of a plurality of detector output metallic leads 17 in which the leads are electrically connected between island 10 and input diffusions 21. Refer also to FIG. 2 along with FIG. 1 to illustrate the CCD input means. The input pad voltage source and drivers 20a is comprised of various voltages that are applied to two separate electrical gates Vg and Vs that form each input CCD pad 20. Vg is known as an input gate and has voltages of 0 and −20 d.c. volts intermittently switched thereon. Vs is known as a store gate and has voltages of −15 d.c. volts and −20 volts intermittently switched thereacross, but with a slight time delay from the voltages switched on gate Vg such that the charge carriers are assured of being moved under the store gate Vs instead of back to the detector island 10. CCD action is then completed by the sequential switching of the phased voltages $V\Phi_1$, $V\Phi_2$, and $V\Phi_3$ as stated herein above.

The extrinsic detector islands 10 may also be made sensitive in the 8-14 micrometer wavelength region, but since sapphire does not transmit in this region the radiation would have to be received from the silicon side of the SOS-CCD wafer.

Figure 4:
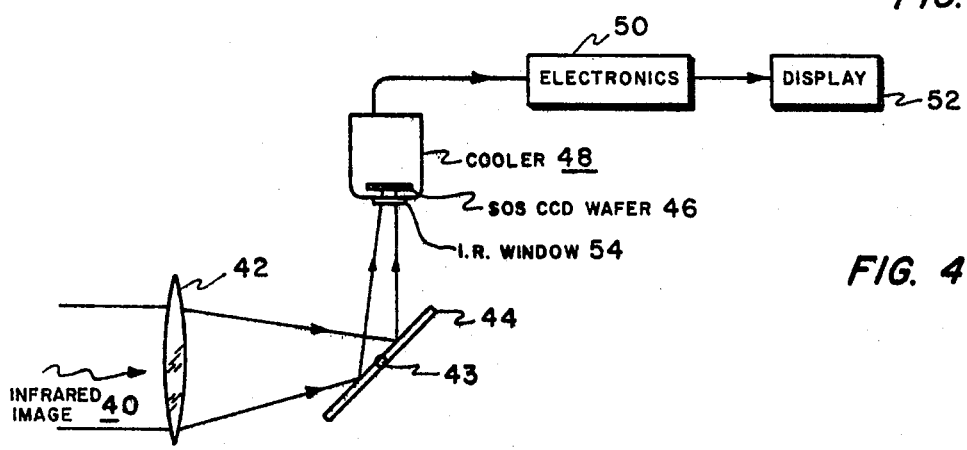
FIG. 4 illustrates the outline of the imaging IR system in which the present SOS-CCD wafer is used.

FIG. 4 shows a schematic of the imaging IR system in which the present SOS-CCD wafer 46 is used. An incoming IR image 40 is imaged by objective lens 42 and projects the image on scanning mirror 44, scanning about axis 43. The image is reflected off the front surface of mirror 44, through IR window 54 onto detector islands 10 on wafer 46 within cooler 48. The wafer 46 is cooled by cooler 48 to assure proper operation of the detectors. The processing electronics 50 and display 52 are standard.

We claim:
1. An extrinsic silicon infrared detector array and charge-coupled device readout comprising:
   a layer of electrical insulator substrate material;
   a plurality of extrinsic silicon detectors mounted on the bare surface of one side of said substrate material, wherein said plurality of extrinsic silicon detectors are doped for sensitivity in the infrared wavelength region;
   a silicon CCD signal readout structure mounted on the bare surface of said one side of said substrate material in proximity to but isolated from said plurality of extrinsic silicon detectors;
   a plurality of input diffusions deposited in said silicon CCD signal readout structure;
   a buss line voltage source commonly connected to the input side of all of said plurality of extrinsic silicon detectors;
   an insulating layer deposited over all of said silicon CCD signal readout structure except over said plurality of input diffusions;
   a plurality of conductive leads electrically connected from an output side of said plurality of extrinsic silicon detectors to said plurality of input diffusions;

a plurality of CCD pads deposited on said insulating layer;
a CCD phased voltage source;
a plurality of CCD voltage drive lines connected between said CCD phased voltage source and said plurality of CCD pads for driving phased voltages across said plurality of CCD pads;
an input CCD pad voltage source and driver; and
a plurality of input structure pads deposited on said insulating layer between said plurality of input diffusions and said plurality of CCD pads, wherein all of said plurality of input structure pads are commonly electrically connected to said input CCD pad voltage source and driver and are intermittently connected to said CCD pads in some selected phasing from each of said plurality of extrinsic silicon detectors wherein said input CCD pad voltage source and driver sequentially switches a voltage on said plurality of input structure pads to readout signals from said plurality of extrinsic silicon detectors caused by infrared radiation coming through said substrate material impinging thereon and injecting said readout signals in the layer of said silicon CCD signal readout structure that is immediately below said intermittently connected CCD pads for signal readout therefrom in some desired mode.

2. A structure as set forth in claim 1 wherein said plurality of extrinsic silicon detectors are made sensitive in the 8–14 micrometer wavelength region.

3. A structure as set forth in claim 1 wherein said layer of electrical insulator substrate material in a single crystal substrate of sapphire.

4. A structure as set forth in claim 1 wherein said layer of electrical insulator substrate material is non-conducting spinel.

5. A structure as set forth in claim 3 wherein said substrate of sapphire is 50 mils thick, said plurality of extrinsic silicon detectors are doped p-type and said silicon CCD signal readout structure is doped n-type and both are 2 mils in depth, said insulating layer deposited over said silicon CCD signal readout structure is $SiO_2$ that is about 1500 A thick, and said input diffusions are doped P±type bulk material.

6. A structure as set forth in claim 5 wherein the selected phasing of said plurality of input pads to said CCD pads is three phase.

7. A structure as set forth in claim 5 wherein said selected phasing is two phase.

8. A structure as set forth in claim 5 wherein said selected phasing is four phase.

* * * * *